(12) United States Patent
Nguyen et al.

(10) Patent No.: US 7,307,461 B2
(45) Date of Patent: Dec. 11, 2007

(54) SYSTEM AND METHOD FOR ADAPTIVE DUTY CYCLE OPTIMIZATION

(75) Inventors: Huy Nguyen, San Jose, CA (US); Roxanne Vu, San Jose, CA (US); Leung Yu, Santa Clara, CA (US); Benedict Lau, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 812 days.

(21) Appl. No.: 10/661,225

(22) Filed: Sep. 12, 2003

(65) Prior Publication Data

US 2005/0058233 A1 Mar. 17, 2005

(51) Int. Cl.
*H03K 7/08* (2006.01)

(52) U.S. Cl. .............. 327/172; 327/171; 327/173; 327/174; 327/175

(58) Field of Classification Search ........... 327/175, 327/18, 20, 26
See application file for complete search history.

(56) References Cited

U.S. PATENT DOCUMENTS

| | | | | |
|---|---|---|---|---|
| 4,475,210 A | * | 10/1984 | Couch | 375/224 |
| 6,016,282 A | | 1/2000 | Keeth | 365/233 |
| 6,236,696 B1 | | 5/2001 | Aoki et al. | 375/376 |
| 6,829,316 B1 | * | 12/2004 | Terada et al. | 375/355 |
| 6,862,296 B1 | * | 3/2005 | Desai | 370/503 |
| 2002/0027454 A1 | * | 3/2002 | MacGugan | 327/101 |
| 2004/0161068 A1 | | 8/2004 | Zerbe et al. | 375/355 |

FOREIGN PATENT DOCUMENTS

| | | |
|---|---|---|
| WO | WO 98/37656 | 8/1998 |
| WO | PCT/US2004/021368 | 12/2004 |
| WO | WO 2005/036399 A1 | 4/2005 |

* cited by examiner

*Primary Examiner*—Tuan T. Lam
*Assistant Examiner*—Hiep Nguyen
(74) *Attorney, Agent, or Firm*—Morgan, Lewis & Bockius LLP

(57) ABSTRACT

A system and method for configuring a receiver such that the duty cycle of the receiver clock accurately matches the duty cycle of the data signal received. This adaptive system and method calibrates a receiver's duty cycle to optimize the receiver timing margin for different data signal types and different slave devices. In one embodiment, a duty cycle correction circuit matches the receiver clock to a predetermined duty cycle. The receiver clock is then configured to have a duty cycle skewed from the predetermined duty cycle based on the specific data signal received. In a receiver system utilizing a clock tree, individual branches of the clock tree are configured to have respective duty cycles skewed to match the duty cycle of a data signal received from a specific transmitting device.

42 Claims, 10 Drawing Sheets

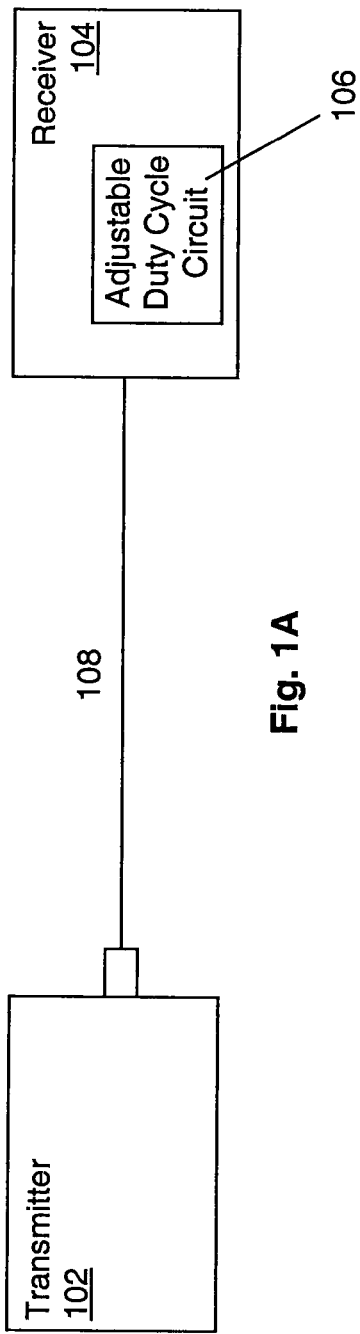
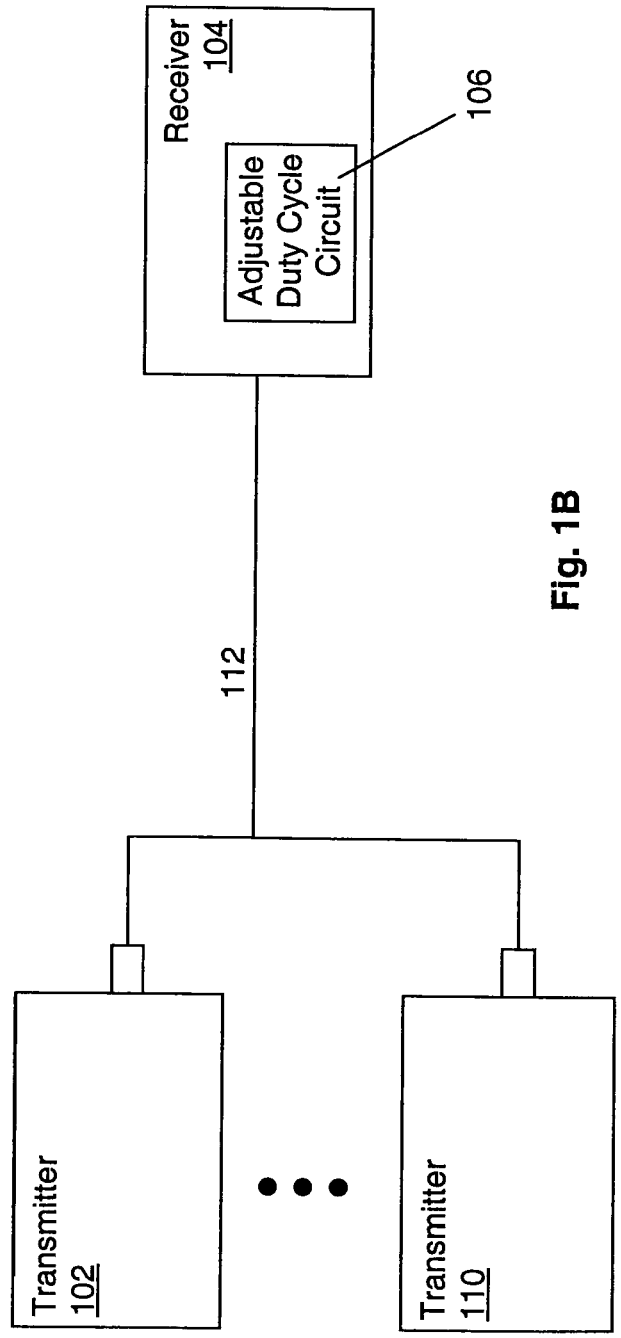

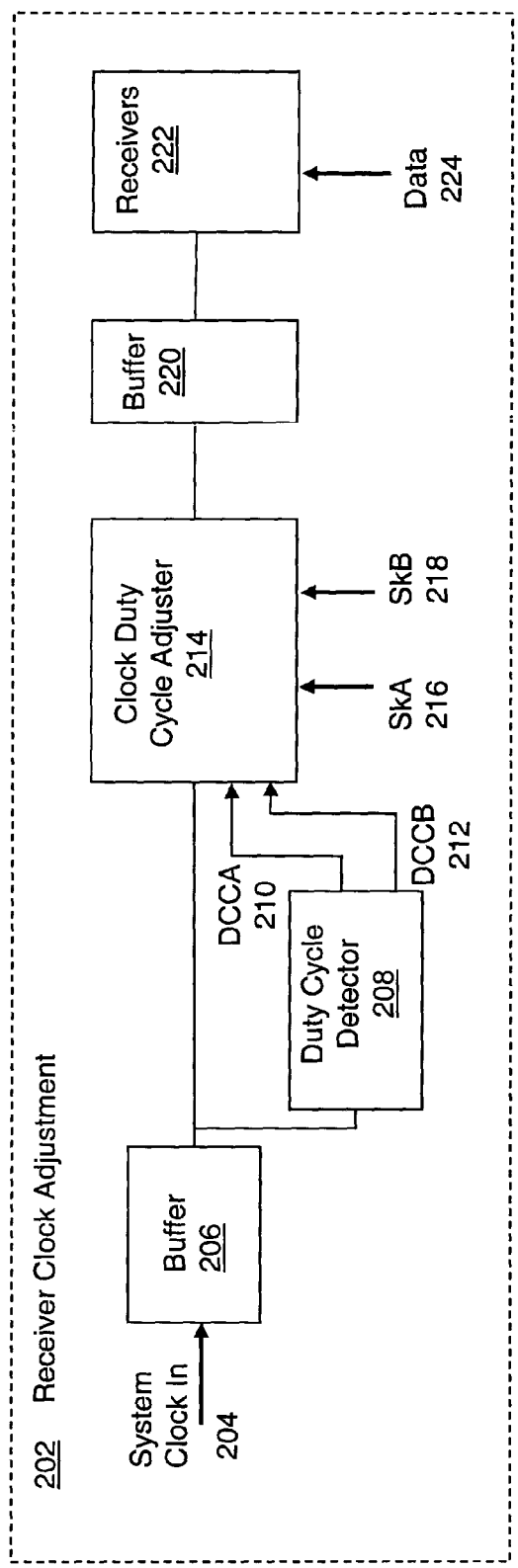
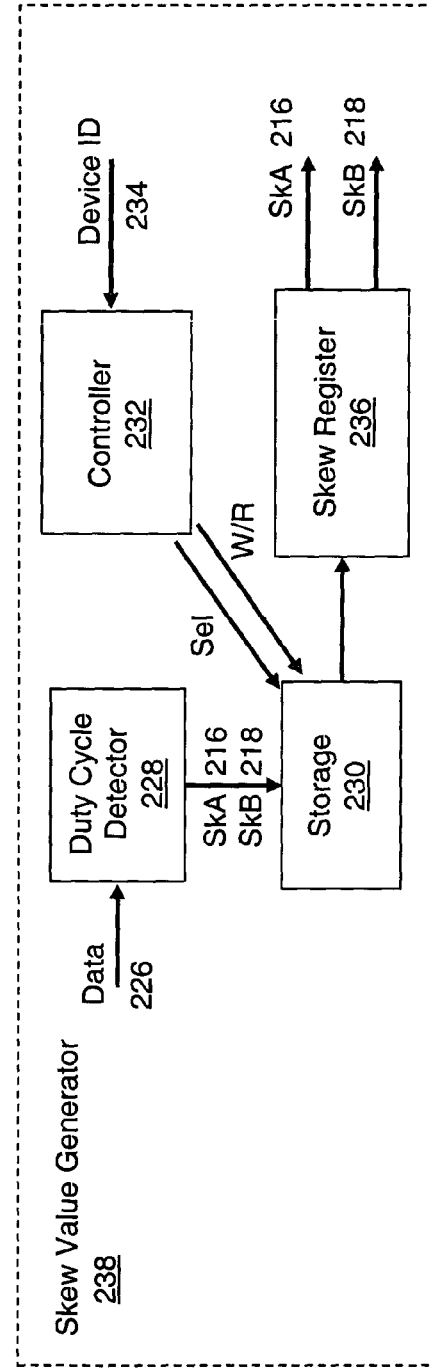
Fig. 2A
Fig. 2B

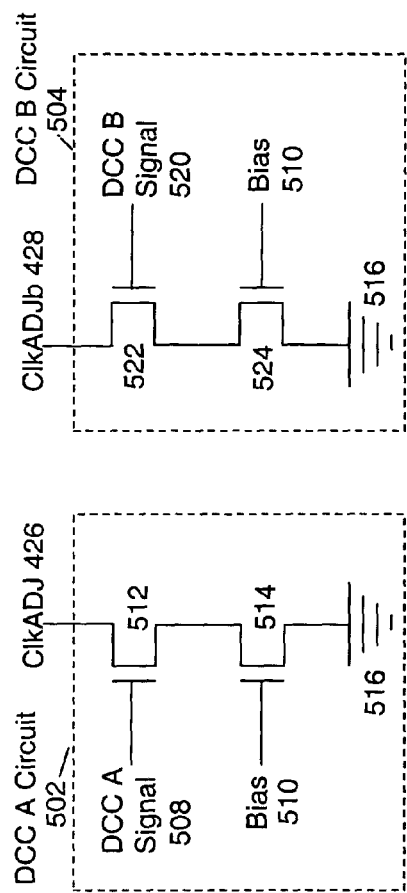
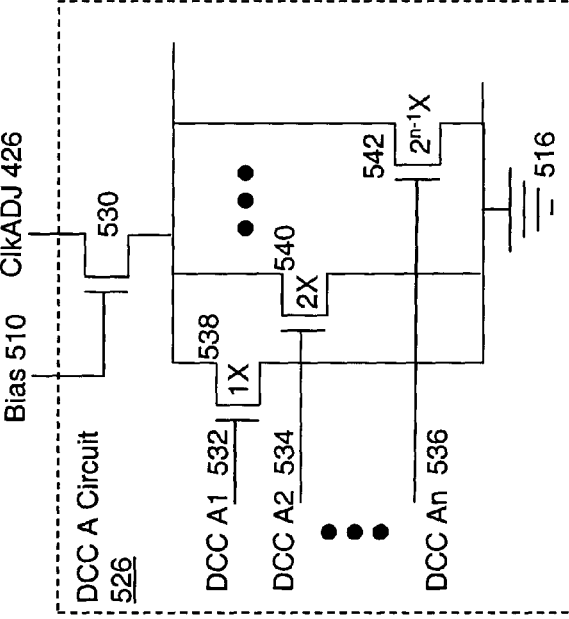
Fig. 5A
Fig. 5B

SYSTEM AND METHOD FOR ADAPTIVE DUTY CYCLE OPTIMIZATION

FIELD OF THE INVENTION

The present invention relates to the field of data transmission, and in particular to systems and methods for adaptive duty cycle optimization for use in receiving data transmissions.

BACKGROUND OF THE INVENTION

Integrated circuits communicate with each other using electrical signals, often carried over a bus. A bus may include one or more interconnects, such as for example traces on a printed circuit board, wires, or cables and connectors. A bus may also be one or more traces or interconnects within an integrated circuit. A bus forms one or more signal paths that carry signals from an output driver to a receiver device. Both the sending and receiving devices may be integrated circuits. A bus may also be used to carry a signal between sending and receiver devices located on the same integrated circuit. As integrated circuits have evolved, many different signaling type standards have been defined that specify the characteristics of the electrical signals. The signaling type typically defines such characteristics as the reference voltage and duty cycle for the electrical signals. Examples of signaling types are stub-series terminated logic (SSTL), Rambus signaling level (RSL), HSTL, LVDS and DRSL (differential Rambus signaling level).

Buses are commonly employed for transmitting data, commands, clock signals or other information between computer devices. To properly receive data transmitted over a bus, the receiver typically has the capability of synchronizing itself with a clock signal that is transmitted in parallel with the data. Thus, an output driver may transmit both a data signal and a clock or synchronization signal to allow the receiver to properly receive and decode the transmitted data.

The speed and integrity of signals transmitted over a bus are often of critical importance. An output driver sends a data stream that has a specific duty cycle which should correspond to the synchronization signal of the output driver. A receiver reads and processes the data stream using a specific receiving duty cycle.

To maximize the speed and integrity of the transmission of the data stream, ideally the receiver's duty cycle matches the duty cycle of the received data signal. By having the duty cycles match, the receiver is configured to read the data stream with the eye of the data centered within a read cycle of the receiver and having a sufficient margin for the data to be read fully within the read cycle. The eye of the data represents a mid-point of the data within the data stream to be read during a single read cycle of the receiver.

There are a variety of challenges associated with matching the duty cycle of the received data signal with the receiver's duty cycle. The receiver may receive data streams from multiple devices, each having its own output driver. Each device's output driver may have a different duty cycle. Although output drivers generate signals typically having about a 50% duty cycle, some output drivers generate signals having duty cycle between 45% and 55%, or even between 40% and 60%, where the duty cycle of a signal is defined as the amount of time that a first bit (or symbol) of a signal is asserted on a signal line divided by the total amount of time that the first and a next bit of the signal are asserted on the signal line. If the signal is periodic, such that the first, third, fifth, etc. bits have a first of two signal levels and the other bits, i.e., the second, fourth, sixth, etc. bits have the second of the two signal levels, then the duty cycle of the signal is the percentage of time that the signal is above a common mode voltage. In addition, there are many different factors that can affect the electric signals sent between devices. For example, the packaging methodology for an integrated circuit can affect the electric signals that are sent from the integrated circuit. Additionally, the duty cycle needed to synchronize the receiver with the data signal duty cycle may vary based on such factors as the physical distance the signal travels, the operating temperature of the receiver device, and the like.

Thus, the actual duty cycle of the data signal when it arrives at the receiver may vary from the target duty cycle of the output driver driving the data signal. When the duty cycle of the data signal and the duty cycle of the receiver are not matched, the data transmission is not optimal. As a result, errors may occur during data reception, causing a portion of the information within the data signal stream to be lost at the receiver. As a result of such duty cycle mismatching, the rate of data transmission may need to be slowed to ensure acceptable data transmission reliability, or information may need to be transmitted multiple times to ensure acceptable reliability.

It would be beneficial to be able to tune the duty cycle of a receiver in real time to accommodate variations in the duty cycles of the data received by the receiver. It would be beneficial to adjust a receiver's clock duty cycle to match the duty cycle of a received data signal. Specifically, it would be beneficial to adjust a receiver's clock duty cycle to a duty cycle that is not always 50% in order to match the receiving clock duty cycle to the duty cycle of an incoming data signal. Additionally, it would be beneficial to have circuits that are able to communicate utilizing different signaling types.

BRIEF DESCRIPTION OF THE DRAWINGS

The aforementioned features and advantages of the invention as well as additional features and advantages thereof will be more clearly understood hereinafter as a result of a detailed description of preferred embodiments of the invention when taken in conjunction with the drawings. Like reference numerals designate like portions.

FIG. 1A is a block diagram of a transmitter and a receiver with an adjustable duty cycle circuit.

FIG. 1B is a block diagram of multiple transmitters and a receiver with an adjustable duty cycle circuit.

FIG. 2A is a block diagram of an embodiment of a receiver clock circuit having a clock duty cycle adjuster circuit.

FIG. 2B is a block diagram of an embodiment of a skew value generator circuit.

FIGS. 5A and 5B are circuit diagrams of alternate embodiments of duty cycle correction circuits.

DESCRIPTION OF THE PREFERRED EMBODIMENTS

Figure 2C:
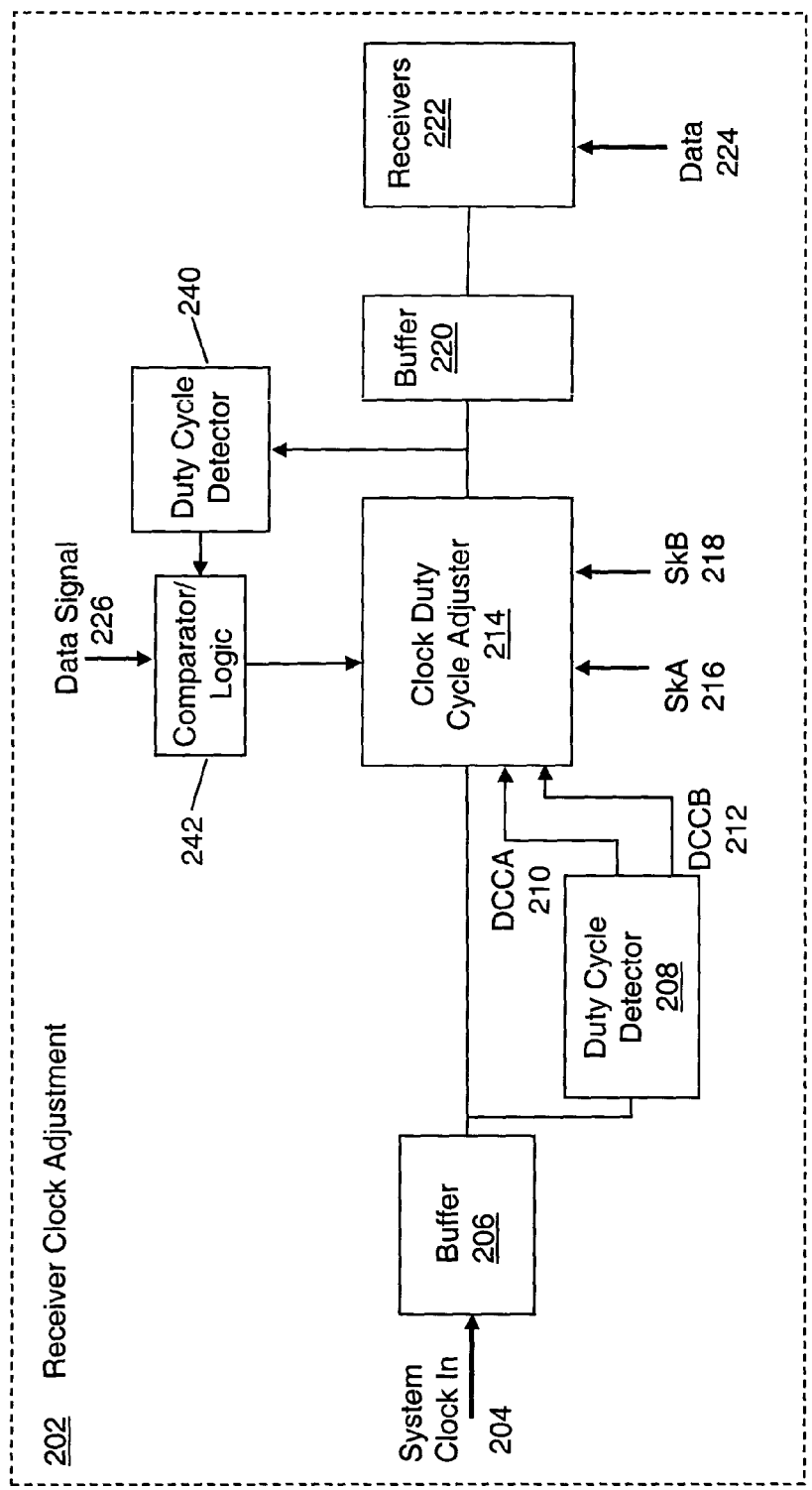
FIG. 2C is a block diagram of an alternate embodiment of a receiver clock circuit having a clock duty cycle adjuster circuit and a feed back loop.

The following systems and methods address problems caused by a receiver clock that has a duty cycle that does not substantially match the duty cycle for a data signal being received. Specifically, the systems and methods described below adjust the duty cycle of the receiver clock to substantially match the duty cycle of a received data signal. Typically, the duty cycles of two signals substantially match when they differ by less than about two percent (e.g., signals substantially matching a 50% duty cycle will have duty cycles ranging from about 49% to about 51%), although other definitions of "substantially matching" may be used in various applications. The duty cycle detection and adjustment circuitry described here is typically implemented in an integrated circuit. The data signal whose duty cycle is being detected and matched may be received from either another integrated circuit, or from a module within the same integrated circuit.

A receiver is automatically configured so that the duty cycle of the receiver clock accurately matches the actual duty cycle of the data signal received at the receiver. The receiver includes duty cycle adaptive circuitry to calibrate the receiver's duty cycle to optimize the receiver for receiving different data signal types from different devices. In one embodiment, a duty cycle correction circuit matches the receiver clock to a predetermined duty cycle. The receiver clock is then configured to have a duty cycle skewed from the predetermined duty cycle based on the specific data signal received.

In a receiver system utilizing a clock tree, a clock tree duty cycle is configured to match a predetermined duty cycle by using a duty cycle correction circuit. Individual branches of the clock tree are then configured to have respective duty cycles skewed to match the duty cycle of a data signal received from a specific transmitting or slave device.

FIG. 1 illustrates a simplified system for data transmission using an adjustable receiving duty cycle circuit according to one embodiment of the present invention. A signal path 108 is coupled between a transmitter device 102 and a receiver device 104. In some embodiments, the transmitter device 102 and the receiver device 104 are integrated circuits.

An adjustable duty cycle circuit 106 is located within the receiver device 104. In one embodiment, the adjustable duty cycle circuit 106 includes programmable registers and a clock correction circuit for adjusting a duty cycle ratio of a clock within the receiver device 104. In some embodiments, the signal path 108 is a bus comprising a plurality of signal paths. The bus is preferably capable of simultaneously carrying multiple signals between the transmitter 102 and the receiver device 104.

FIG. 1B illustrates a system for data transmission wherein several transmitting devices (102, 110) transmit data over a bus 112 to a receiver device 104. The receiver device 104 has an adjustable duty cycle circuit 106. In one embodiment, the adjustable duty cycle circuit 106 includes programmable registers and clock correction circuits. In some embodiments, the adjustable duty cycle circuit 106 includes preprogrammed registers for storing multiple receiving duty cycles ratios wherein each receiving duty cycle ratio corresponds to a signal from one of the transmitters or to a signal from a specific output driver of one of the transmitters.

In some embodiments of the data transmission systems of FIGS. 1A and 1B, the transmitter device 102 is a CPU (central processing unit, such as for example a Pentium® IV processor) and the receiver device 104 is a memory controller. In another embodiment, the transmitter device 102 is a memory controller, and the receiver device 104 is a memory device, such as a SDRAM (Synchronous Dynamic Random Access Memory), DDR (Double Data Rate) SDRAM, RDRAM® device, SRAM (Static Random Access Memory), or the like.

Embodiments of the adjustable duty cycle circuit 106 of FIGS. 1A and 1B have two main parts: a duty cycle correction (DCC) circuit and a receiver clock adjustment circuit. The DCC circuit adjusts the duty cycle of the receiver clock to a predetermined duty cycle. The DCC circuit serves to bring the receiver clock duty cycle to an initial predetermined duty cycle. Typically, the predetermined duty cycle is 50%. The receiver clock is generated based on a system clock, and the system clock may not be received by the receiver at the predetermined duty cycle. DCC corrects the receiver clock to better match the predetermined duty cycle by reducing the difference between the duty cycle of the receiver clock and the predetermined duty cycle. In embodiments used within a clock tree structure, the system clock may be corrected to the predetermined duty cycle before being transmitted to all of the clock generators in the clock tree.

The receiver clock adjustment circuit adjusts the receiver clock to match the duty cycle of a received data stream. If the received data stream does not have a duty cycle substantially equivalent to the predetermined duty cycle (e.g., 50%), then the receiver clock correction circuit adjusts or skews the receiver clock duty cycle away from the predetermined duty cycle in order to more closely match the receiver clock duty cycle to that of the received data stream. Skewing the receiver clock duty cycle reduces the difference between the received data signal duty cycle and the receiver clock duty signal. It will be understood that the DCC circuit and receiver clock adjustment circuit may be separate circuits or part of a larger circuit.

FIG. 2A illustrates an embodiment of a receiver clock adjustment circuit 202. A system clock signal 204 is received in a buffer 206. From buffer 206, the system clock signal is transmitted to both a clock duty cycle adjuster 214 and a duty cycle detector 208. The duty cycle detector detects the duty cycle of the system clock signal. Duty cycle detector 208 generates one or more duty cycle correction (DCC) values. DCC values are typically stored in programmable registers. For example, FIG. 2A illustrates two such values—DCC A 210 and DCC B 212— that are used by two sides of the clock duty cycle adjuster 214 in correcting the receiver clock duty cycle to match a predetermined duty cycle. In some embodiments, even if two or more DCC values are generated by the duty cycle detector, only one of the DCC values is "active" and has a value that differs from its nominal or default value while the other DCC value or values are set equal to the nominal or default values. In some embodiments, logic or data tables (not shown) may be included within the duty cycle detector 208 or coupled thereto for determining what DCC values correspond to the detected duty cycle. Such logic or data tables serve to translate the duty cycle detector values into DCC values that can be used by the clock duty cycle adjuster circuits to correct the receiver clock to a predetermined duty cycle.

Additionally, some embodiments include an analog-to-digital converter to convert analog signals from the duty cycle detector 208 into digital values that can be used by the duty cycle correction circuits within the clock duty cycle adjuster 214. Further embodiments include a comparator to determine a difference between the detected duty cycle and the predetermined duty cycle. The difference is then used by the duty cycle correction circuits in the clock duty cycle adjuster 214 to correct the receiver clock duty cycle to match the duty cycle of the predetermined duty cycle. Thus, DCC values 210, 212 and clock duty cycle adjuster 214 correct the receiver clock signal to have a corrected duty cycle. This correction includes altering the receiver clock duty cycle in order to reduce the difference between the corrected receiver clock duty cycle and the predetermined duty cycle. Specifically, the DCC values are configured to cause the clock duty cycle adjuster to correct the receiver clock duty cycle such that the difference between the corrected receiver clock duty cycle and the predetermined duty cycle is less than the initial difference between the system clock duty cycle and the predetermined duty cycle.

Additionally, one or more skew values (i.e., SkA 216 and SkB 218) are provided to the duty cycle adjuster to adjust the receiver clock duty cycle from its corrected duty cycle to a duty cycle that substantially matches the duty cycle of a data signal received by the receiver. If the duty cycle of the received data signal is not 50%, the skew values cause the clock duty cycle adjuster 214 to adjust the clock receiver duty cycle away from 50% in order to reduce the difference between the received data signal duty cycle and the receiver clock signal duty cycle. The difference between the received data signal duty cycle and the predetermined duty cycle is used to generate skew values. The skew values are configured so as to cause the clock duty cycle adjuster to adjust the receiver clock duty cycle such that the difference between the receiver clock duty cycle and the received data signal duty cycle is less than the difference between the received data signal duty cycle and the predetermined duty cycle. The adjusted receiver clock duty cycle is buffered in buffer 220 before being applied to one or more receivers 222 for use in receiving data signals 224. The appropriate duty cycle adjustment of the receiver clock may be determined in a calibration and then applied when the receiver receives the data signal. For ease of analysis and determination of the appropriate duty cycle clock adjustment, a symmetric or periodic data signal 224 may be used.

FIG. 2B illustrates an embodiment of a skew value generation circuit 238 that generates one or more skew values for use by the clock duty cycle adjuster 214 in adjusting the receiver clock duty cycle. A duty cycle detector 228 detects the duty cycle of the data signal 226. Duty cycle detector 228 generates one or more skew values (e.g., SkA 216, SkB 218, etc.). The duty cycle detector 228 may generate digital or analog values. In some embodiments, logic or data tables (not shown) are included either within the duty cycle detector 228 or coupled thereto. Such logic or data tables are used to determine specific skew values (i.e., bits) that will be used by the clock duty cycle adjuster 214 to adjust the receiver clock duty cycle to match the duty cycle of the data signal. In alternate embodiments, duty cycle detector 228 includes or is coupled to a comparator that determines the difference between the data signal duty cycle and the predetermined duty cycle. The skew values (i.e., SkA, SkB) are then based on this difference.

In some embodiments, the skew values are stored in a storage (e.g., a register, memory array, or the like) 230, which is often digital storage, but may also include analog storage. A controller 232 communicates with storage 230 to control the reading and writing of skew values and other information into storage 230. In some embodiments, controller 232 receives a device ID 234 for a device that is transmitting the data signal being received by the receiver. The device ID 234 may be stored in storage 230 in association with the skew values generated for that transmitting device. The device ID 234 may also be used by the controller 232 to select the register or memory location in storage 230 to access when storing or reading skew values, regardless of whether the device ID is stored along with skew values in storage 230 or not. Controller 232 issues select (Sel) and write/read (W/R) commands to control the selection, writing and reading of data stored in storage 230. As an example, the controller receives a device ID 234 indicating that a given device is transmitting a data signal to the receiver. The controller 232 issues a command to write the corresponding skew values in storage 230 in association with the device ID. The controller 232 may also issue a read command immediately or at a later time to have the skew values associated with the transmitting device ID 234 read out into skew register 236. Skew register 236 is typically coupled to the clock duty cycle adjuster 214 of FIG. 2A such that skew values (e.g., SkA 216, SkB 218) are made available for adjusting the receiver clock duty cycle.

Still referring to FIGS. 2A and 2B, in some embodiments the device in which the receiver clock circuitry of FIGS. 2A and 2B resides receives data signals from first and second devices. In some embodiments, the first and second devices are located on different integrated circuits, while in other embodiments the first and second devices are located on a same integrated circuit. During calibration a first adjustment value (e.g., comprising a first set of skew values) will be determined by comparing the duty cycle of the data signal from the first device with a first predetermined duty cycle, and a second adjustment value (e.g., comprising a second set of skew values) will be determined by comparing the duty cycle of the data signal from the second device with a second predetermined duty cycle. In some embodiments the first and second predetermined duty cycles are different, while in other embodiments the first and second predetermined duty cycles are the same. In some embodiments, the first and second devices send data using different signaling types, while in other embodiments the first and second devices send data using the same signaling type. The first and second adjustment values may be stored in storage 230 at locations determined by the device ID's of the first and second devices.

FIG. 2C illustrates an alternate embodiment of a receiver clock adjustment circuit which further includes a feedback loop to check the receiver clock duty cycle after it has been adjusted by clock duty cycle adjuster 214. The receiver clock signal from the clock duty cycle adjuster 214 is detected by a duty cycle detector 240. The detected duty cycle is compared to the duty cycle of the data signal 226 within comparator/logic 242. Comparator/logic 242 may include, for example, a comparator or a differential amplifier that outputs a signal indicating any difference between the receiver clock duty cycle and that of the data signal. The clock duty cycle adjuster 214 is configured to then use any such difference to further adjust the receiver clock to better match its duty cycle to that of the data signal. Additionally, the comparator/logic 242 may include logic to determine an appropriate skew value to output to the clock duty cycle adjuster 214. Skew values from comparator/logic 242 may be used to modify or replace SkA 216 and SkB 218.

Figure 2D:
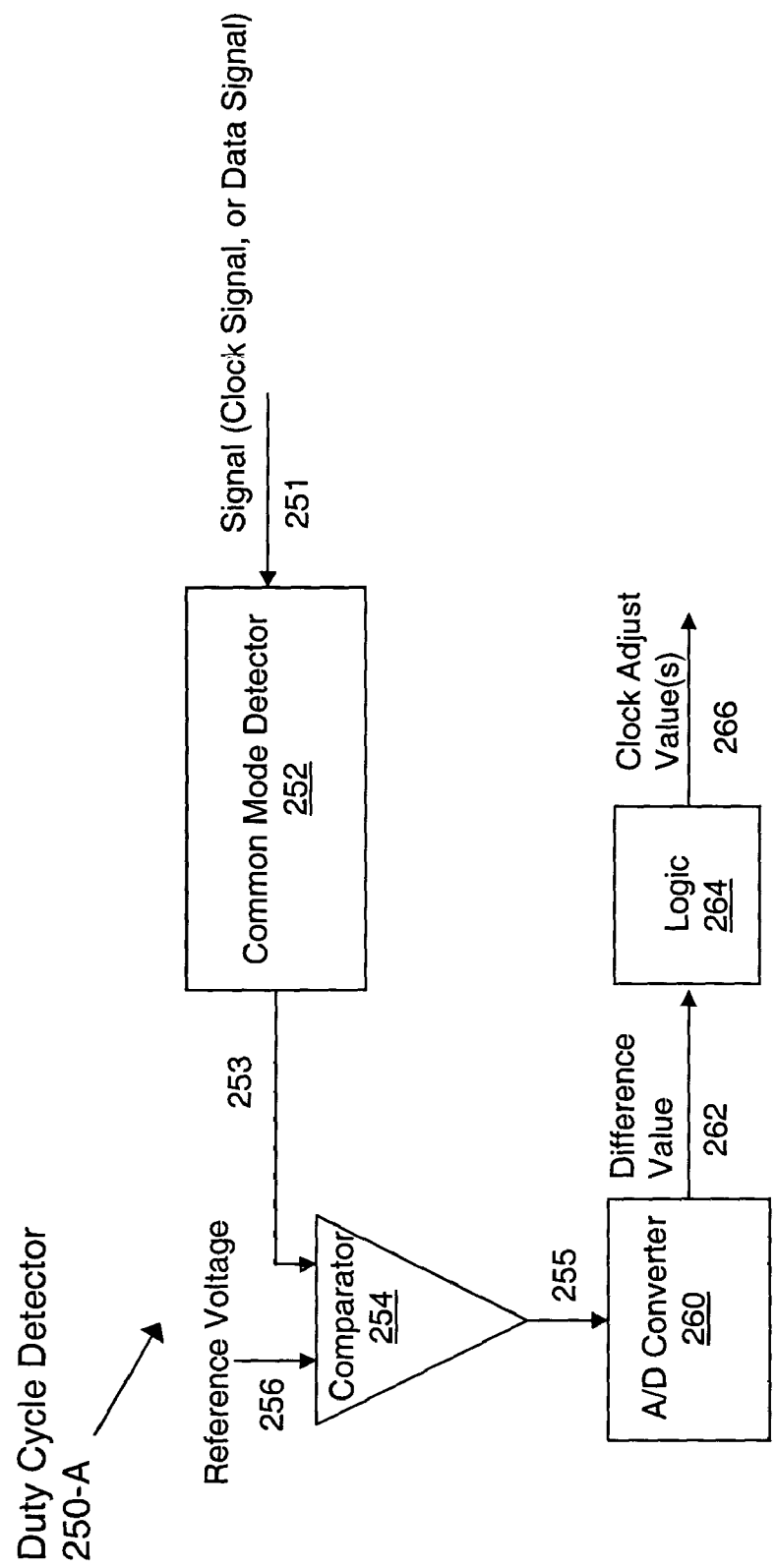
FIG. 2D is a block diagram of a duty cycle detector.

While the present invention may be implemented using any of a variety of duty cycle detectors, two embodiments of a duty cycle detector are described here. FIG. 2D depicts a first embodiment of a duty cycle detector 250-A, suitable for detecting the duty cycle of a system clock signal or the duty cycle of a periodic data signal (see detectors 208, 240 in FIG. 2C). A data signal would be periodic during, for example, a calibration period. Alternately, the data signal may be a "bit balanced signal" having equal numbers of 1-bits and 0-bits during a calibration period. Detector 250-A includes a common mode detector 252, which may be implemented as a low pass filter. The common mode detector 252 outputs a signal 253 that equals or represents the average voltage level of the input signal 251 to the detector 252. The input signal may be either a clock signal or a data signal. The output signal 253 is compared with a reference voltage 256 (or other appropriate reference signal) by a comparator 254. The reference voltage signal 256 is typically the reference voltage for a specific or selected signaling type (e.g., RSL, SSTL, HSTL, LVDS, DRSL, etc.) that corresponds to the signaling type of the signals to be received by the device in which the duty cycle detector resides. In devices that can be used with more than one signaling type, the reference voltage 256 is either provided by an external or programmable voltage source, or is selected (e.g., using a multiplexer or other circuit) from among a plurality of reference voltages. The difference between the common mode voltage of the input signal and a reference voltage is indicative of the difference between the duty cycle of the input signal and a predefined duty cycle. If the reference voltage is set to the common mode voltage associated with a 50% duty cycle of the input signal, then the output of the comparator 255 represents a difference between the input signal's duty cycle and a 50% duty cycle. An analog to digital converter 260 converts the comparator output 255 into a digital difference value 262. In embodiments that utilizes more than one skew control signal, logic 264 is used to process the difference value 262 so as to produce an appropriate set of skew control signals 266.

Figure 2E:
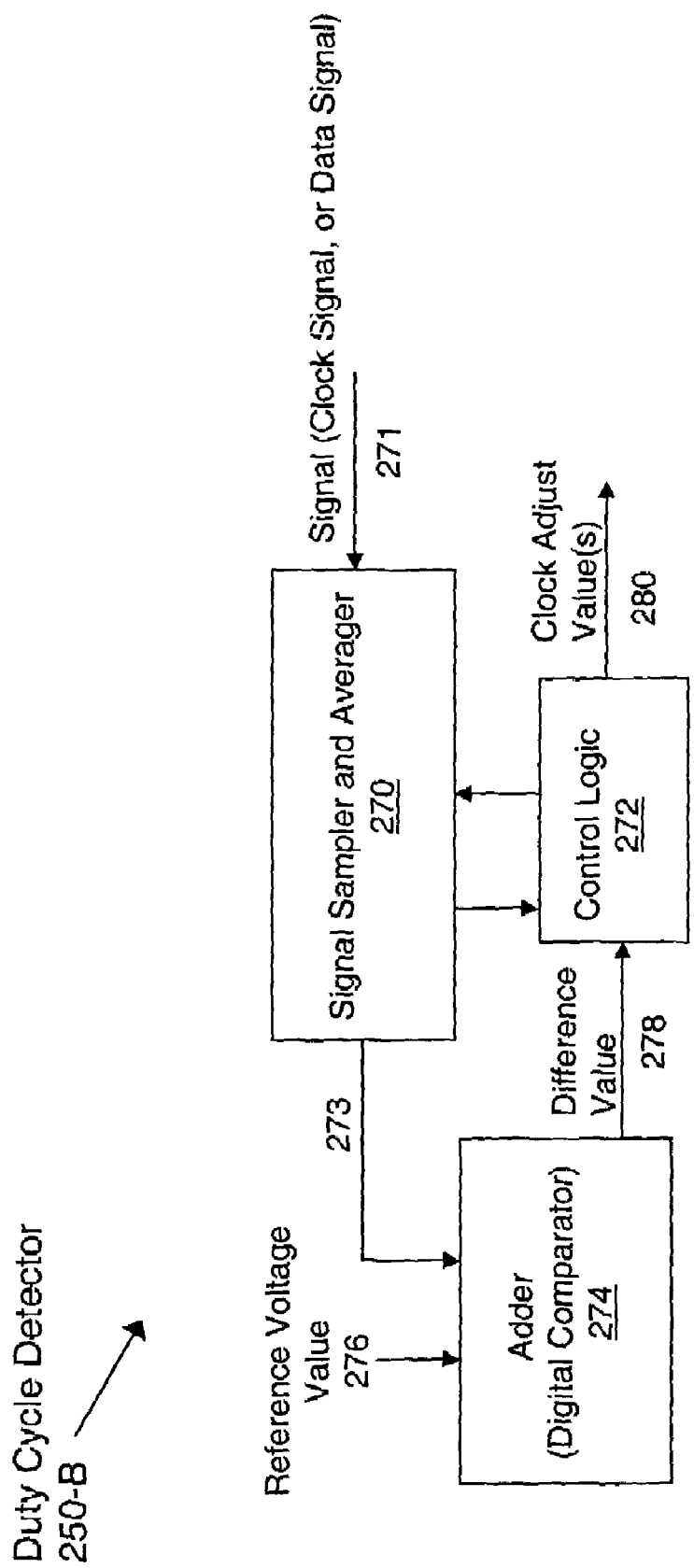
FIG. 2E is a block diagram of another duty cycle detector.

A second embodiment of a duty cycle detector 250-B is shown in FIG. 2E. This detector 250-B uses a digital sampling methodology instead of the analog methodology of the detector 250-A shown in FIG. 2D. The detector 250-B of FIG. 2E includes a digital signal sampler and averager 270 which samples an input signal 271 so as to develop an output signal 273 representative of the either common mode voltage or the duty cycle of the input signal 271. The signal sampler and averager 270 may be configured to sample the input signal, over a period of many clock cycles, so as to sample the input signal at an evenly distributed set of clock phases (e.g., at even increments of 2°). This may be done under the control of control logic 272, which may provide sampling timing signals to the signal sampler. The output signal 273 from the signal sampler and averager 270 is compared with a reference value 276 (which is a reference voltage value when the output signal 273 represents an input signal average voltage) by an adder 274, which subtracts the output signal 273 from the reference voltage 276, or vice versa. The resulting difference value 278 is then processed by control logic 272 to produce the clock adjust values or skew values 280 required for adjusting the duty cycle of a clock signal.

Figure 3:
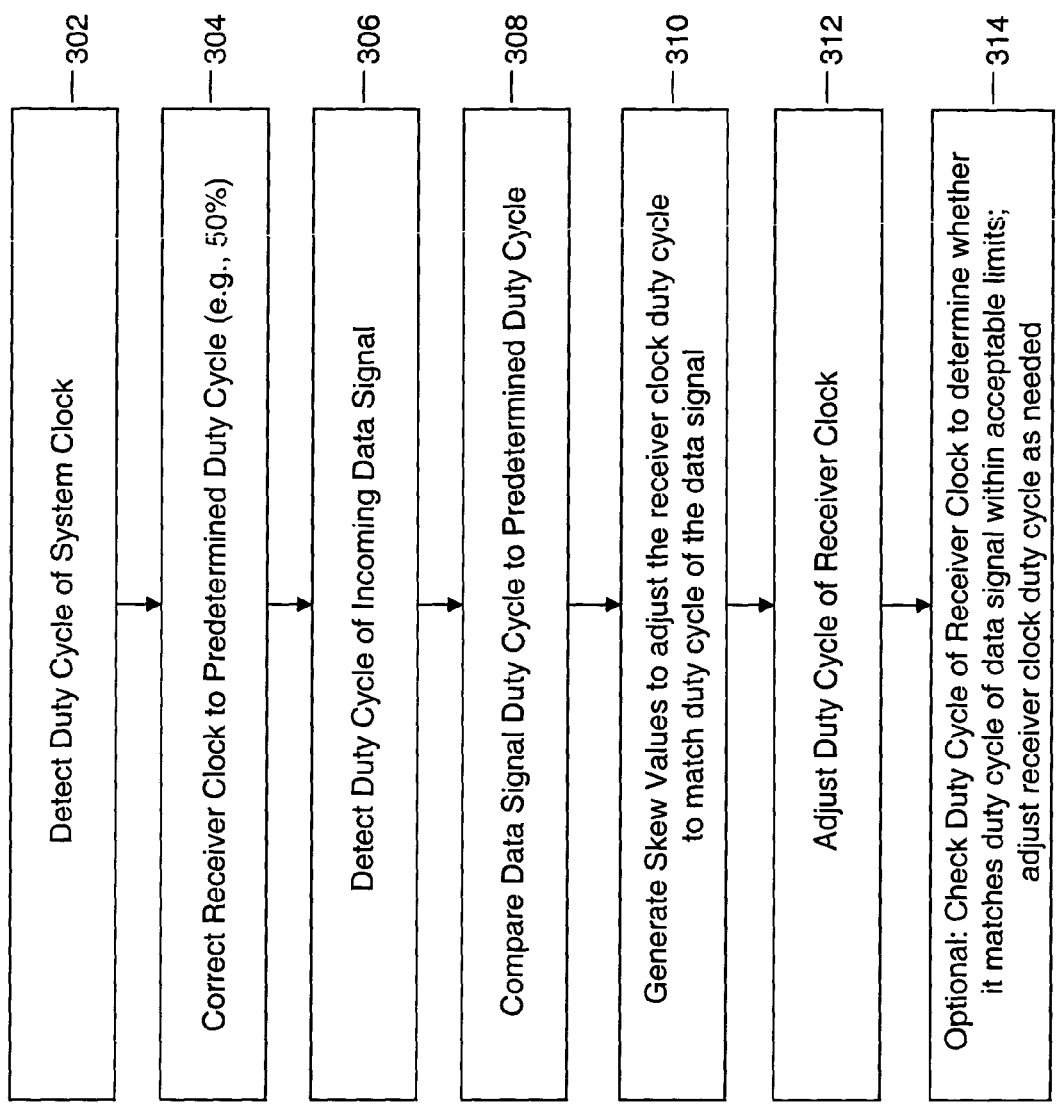
FIG. 3 is a flowchart of an embodiment of a process for adjusting the duty cycle of a receiver clock to match the duty cycle of a received data signal.

FIG. 3 illustrates an embodiment of a process for adjusting a receiver clock duty cycle to match that of a received data signal. At step 302, the duty cycle of a system clock signal is detected. A receiver clock circuit (e.g., the clock duty cycle adjuster 214 of FIG. 2C) will typically generate a receiver clock signal based on the system clock signal. At times, the detected system clock signal will not match a predetermined duty cycle (e.g., 50%). At step 304, the receiver clock circuit is corrected to ensure that it produces a receiver clock signal having the predetermined duty cycle. While other duty cycles may be used, a 50% duty cycle provides a symmetrical baseline to be compared to the duty cycle of a data signal received by the receiver. Typically the difference between the predetermined duty cycle and the system clock duty cycle will be less than about 10% of the predetermined duty cycle, although some embodiments are configured to correct larger differences.

At step 306, the duty cycle of an incoming data signal is detected. At step 308, the data signal duty cycle is compared to the predetermined duty cycle. Typically the difference between the predetermined duty cycle and the data signal duty cycle will be less than about 10% of the predetermined duty cycle, although some embodiments are configured to correct larger differences. At step 310, if the data signal has a duty cycle that is different from the predetermined duty cycle, one or more skew values are generated. The skew values are configured to be used by a duty cycle adjuster circuit in adjusting the receiver clock duty cycle by reducing the difference between the data signal duty cycle and the predetermined duty cycle. At step 312, the one or more skew values are used by a duty cycle adjustment circuit to adjust the duty cycle of the receiver clock. At step 314, the adjusted duty cycle of the receiver clock is optionally checked to determine whether it matches the duty cycle of the data signal. If it does not match, then the receiver clock duty cycle may be adjusted further. Optional step 314 may be repeated as many times as necessary to achieve an acceptable or substantial match between the duty cycles of the data signal and the receiver clock. In some embodiments, step 314 is performed a predefined number of times (e.g., between 5 and 10 times) in order to bring the duty cycle of the receiver clock signal within a predefined margin (e.g., 2%, or other predefined value between 0.5% and 2%) of a predefined target duty cycle (e.g., 50%, or other predefined value between 45% and 55%).

Figure 4:
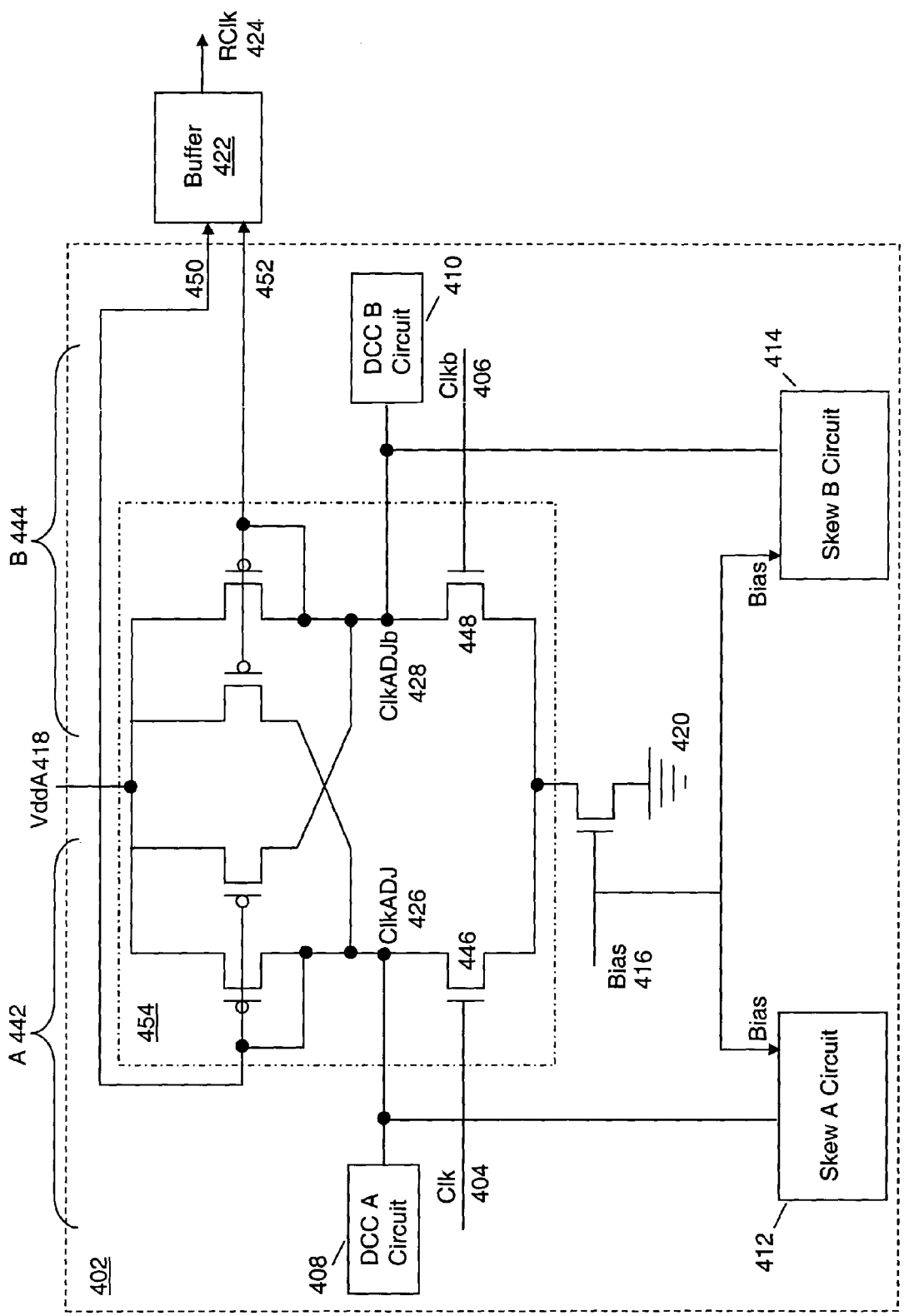
FIG. 4 is a circuit diagram of an embodiment of a circuit configured to skew the duty cycle of a receiver clock to match the duty cycle of a received data signal.

FIG. 4 illustrates an embodiment of a clock duty cycle adjuster circuit 402. In the embodiment illustrated in FIG. 4, duty cycle adjuster circuit 402 includes two sides —an A side 442 and a B side 444. The duty cycle of the receiver clock signal is increased or decreased by altering the slew rate (i.e., the slope of the rising or falling edges) of one of the two signals that together form an intermediate differential clock signal (on lines 450, 452). Typically, one side operates to increase or decrease the slope of the rising or falling edge of output clock signals, while the other side operates to increase or decrease the slope of the rising or falling edge of the clock bar (i.e., inverted clock) signal. By altering the speed with which clock signal edges rise or fall, the slope is affected and the duty cycle changed. Each side shown in FIG. 4 includes a duty cycle correction (DCC) circuit (408, 410) and a skew circuit (412, 414). The DCC and skew circuits are coupled to a differential amplifier 454. DCC circuits (408, 410) correct the incoming system clock signal 404 and incoming system clock bar signal 406 to have a predetermined duty cycle by providing appropriate signals to the differential amplifier 454 to cause it to alter the slew rate of the rising and/or falling edge of receiver clock. Skew circuits (412, 414) alter the system clock signals (404, 406) to match the duty cycle of a received data signal by providing appropriate signals to the differential amplifier 454 to cause it to alter the slew rate of the rising and/or falling edge of the receiver clock.

Clock duty cycle adjuster circuit 402 receives a supply voltage (VddA) 418, and clock duty cycle adjuster circuit 402 includes a ground connection 420. The output for clock duty cycle adjuster circuit 402 is an adjusted clock signal 450 and an adjusted inverted clock signal 452 (sometimes calls the clock bar signal). These output signals are received by a buffer 422, which generates a receiver clock signal (RClk) 424 from the received differential clock signal 450, 452. The receiver clock signal, RClk 424, may be either a differential or single ended clock signal.

A system clock signal (Clk) 404 and an inverted system clock signal (Clkb) 406 are input to the gates of transistors 446 and 448 of the differential amplifier circuit 454. Differential amplifier circuit 454 is an example of one of many differential amplifier configurations that may be used to alter the slew rate of the receiver clock signal 424. One or more bias signals (e.g., bias 416) are applied to bias the circuit 402 in order to scale the currents used by various parts of the circuit. Transistor 446 is coupled to a clock adjustment node (ClkADJ) 426 within the differential amplifier circuit 454. ClkADJ 426 is the node at which corrections and adjustments are applied to Clk 404 on side A 442 of the clock duty cycle adjuster circuit 402. Transistor 448 is coupled to a clock adjustment bar node (ClkADJb) 428 within differential amplifier 454. ClkADJ 428 is the node at which corrections and adjustments are applied to Clkb 406 on side B 444 of the clock duty cycle adjuster circuit 402. On side A 442, DCC A Circuit 408 and Skew A Circuit 412 are coupled to ClkADJ 426 in order to alter the slew rate of the signal on ClkADJ 426. On side B 444, DCC B circuit 410 and Skew B circuit 414 are coupled to ClkADJb 428 in order to alter the slew rate of the signal on ClkADJb 428. Altering the slew rate of signals on either or both of ClkADJ 426 and ClkADJb 428 alters the adjusted clock signal 450 and adjusted clock bar signal 452, which the receiver clock uses to generate the receiver clock signal 424.

FIGS. 5A and 5B illustrate alternate examples of the DCC circuits 408, 410 (FIG. 4). In both FIG. 5A and FIG. 5B, a DCC A circuit and a DCC B circuit are shown. Typically the A side and B side DCC circuits will be similar or mirror images of each other, although this is not required. Each side will typically receive separate and distinct DCC signals (e.g., DCC A signal 508 will differ from DCC B signal 520). In the embodiments shown in FIGS. 5A and 5B, the same bias voltage (510) is applied to both the DCC A and DCC B circuits; however different biases may be applied to each DCC circuit. In some embodiments, one bias signal is applied to all bias transistors in the duty cycle adjuster circuit. In FIG. 5A, DCC A Circuit 502 is coupled to a clock adjustment node (ClkADJ) 426 within the differential amplifier described above with reference to FIG. 4. DCC A Circuit 502 includes a bias transistor 514 coupled to circuit ground 516 (or other voltage source) and a DCC A signal transistor 512 is coupled between bias transistor 514 and ClkADJ 426. In another embodiment, the relative positions of transistors 512 and 514 are reversed. DCC A signal transistor 512 receives at its gate a DCC A Signal 508 that causes the differential amplifier to alter the slew rate of the receiver clock signal in order to bring the receiver clock signal duty cycle initially to approximately a baseline 50% duty cycle. In the example of FIG. 5A, DCC A signal 508 is typically an analog signal, and transistors 512 and 514 are typically NMOS transistors. Bias signal 510 is received at the gate of bias transistor 514 and operates to limit the amount of current that can be drawn by DCC A circuit 502.

DCC B Circuit 504 illustrated in FIG. 5A is similar to DCC A Circuit 502, with the exceptions that DCC B Circuit 504 is coupled to clock bar adjustment node (ClkbADJ) 428 in the differential amplifier illustrated in FIG. 4, and the DCC B signal transistor 522 receives a DCC B Signal 520 that causes the differential amplifier to alter the slew rate of the receiver clock bar signal (i.e., the inverted clock signal) in order to correct the receiver clock signal duty cycle initially to approximately a base line 50% duty cycle. In the example of FIG. 5A, DCC B signal 520 is typically an analog signal, and transistors 522 and 524 are typically an NMOS transistors. In other embodiments, transistors 512, 514, 522 and 524 may be replaced with other types of transistors 512. In other embodiments, circuits 502 and 504 may be replaced with pull-up circuits in place of the pull-down circuits shown in FIG. 5A.

FIG. 5B illustrates an alternate embodiment of a DCC A Circuit and a DCC B Circuit. DCC A Circuit 526 includes a circuit ground connection 516 and a bias transistor 530. Bias transistor 530 is coupled to ClkADJ 506 and to two or more parallel transistors (e.g., 538-542). Bias transistor 530 receives a bias signal 510 that operates to scale or limit the amount of current that can be drawn by circuit 526 from node ClkADJ 426. The example illustrated in FIG. 5B shows these parallel transistors to be binary-weighted such that each successive parallel transistor has twice the current drive capability of its preceding, smaller neighbor (e.g., transistor 540 has twice the current drive capability of transistor 538). Typically, these parallel transistors will be NMOS transistors, and each successive transistor in order will have a channel width that is either twice or one-half that of the adjacent transistors. Any number (n) of parallel transistors may be included such that a signal having n digits in binary format can be used to turn on or turn off the n parallel transistors 538-542. DCC A1 532, DCC A2 534 and DCC An 536 are individual binary signals (sometimes called bits or digits of a n-bit value) applied to the gates of respective parallel transistors (538, 540, 542) in order to cause an adjustment at ClkADJ 406. DCC B Circuit 528 is similar to DCC A Circuit 526, with the exception that DCC B circuit 528 is connected to ClkbADJ 428 and its parallel binary-weighted transistors 552-556 receive different binary DCC signals DCC B1 546, DCC B2 548 and DCC Bn 550, respectively.

Figure 6:
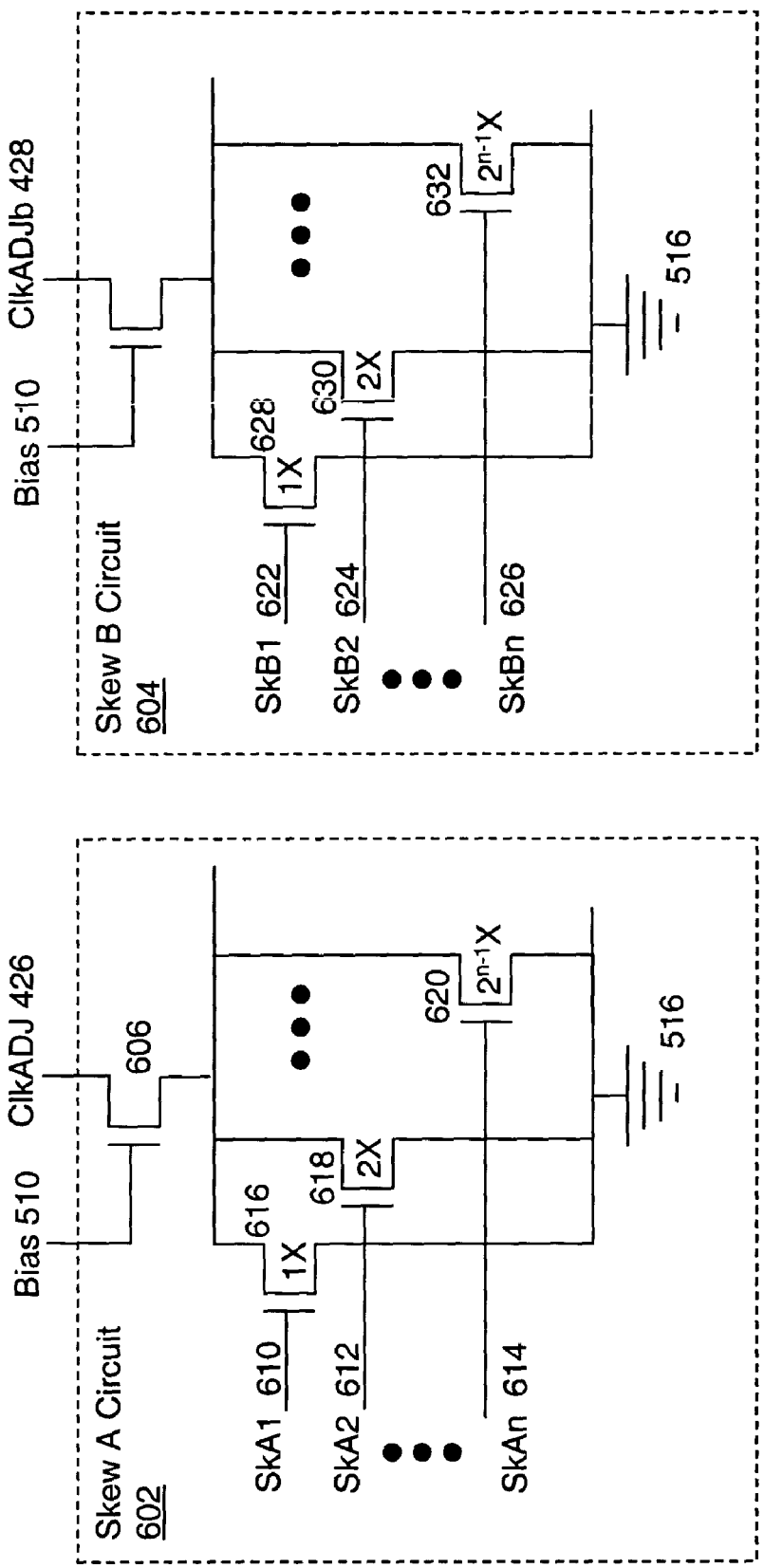
FIG. 6 is a circuit diagram of an embodiment of a pair of duty cycle skew circuits.

FIG. 6 illustrates an embodiment of Skew A Circuit 602 and Skew B Circuit 604, which correspond to Skew A Circuit 412 and Skew B Circuit 414 of FIG. 4. Skew A Circuit 602 has a bias transistor 606 coupled to ClkADJ 426. Bias transistor 606 receives a bias signal 510 that scales or limits the amount of current drawn by circuit 602 from node ClkADJ 426. Parallel transistors 610-614 are typically binary weighted such that each successive NMOS transistor, for example, has a channel width that is twice as long as the preceding transistor. Thus, each successive parallel transistor has twice the current drive capability of the preceding transistor. As such, binary skew values (e.g., SkA1 610, SkA2 612 and SkAn 614) are applied to the gates of parallel transistors 616, 618 and 620, respectively, in order to turn on or turn off the individual parallel transistors in such a way as to cause the intended skew at ClkADJ 426. Skew B Circuit 604 is similar to Skew A Circuit 602, with the exception that it is connected to ClkbADJ 428 and its parallel binary-weighted transistors (e.g., 628, 630, 632) receive different binary skew signals SkB1 622, SkB2 624 and SkBn 626, respectively.

Figure 7:
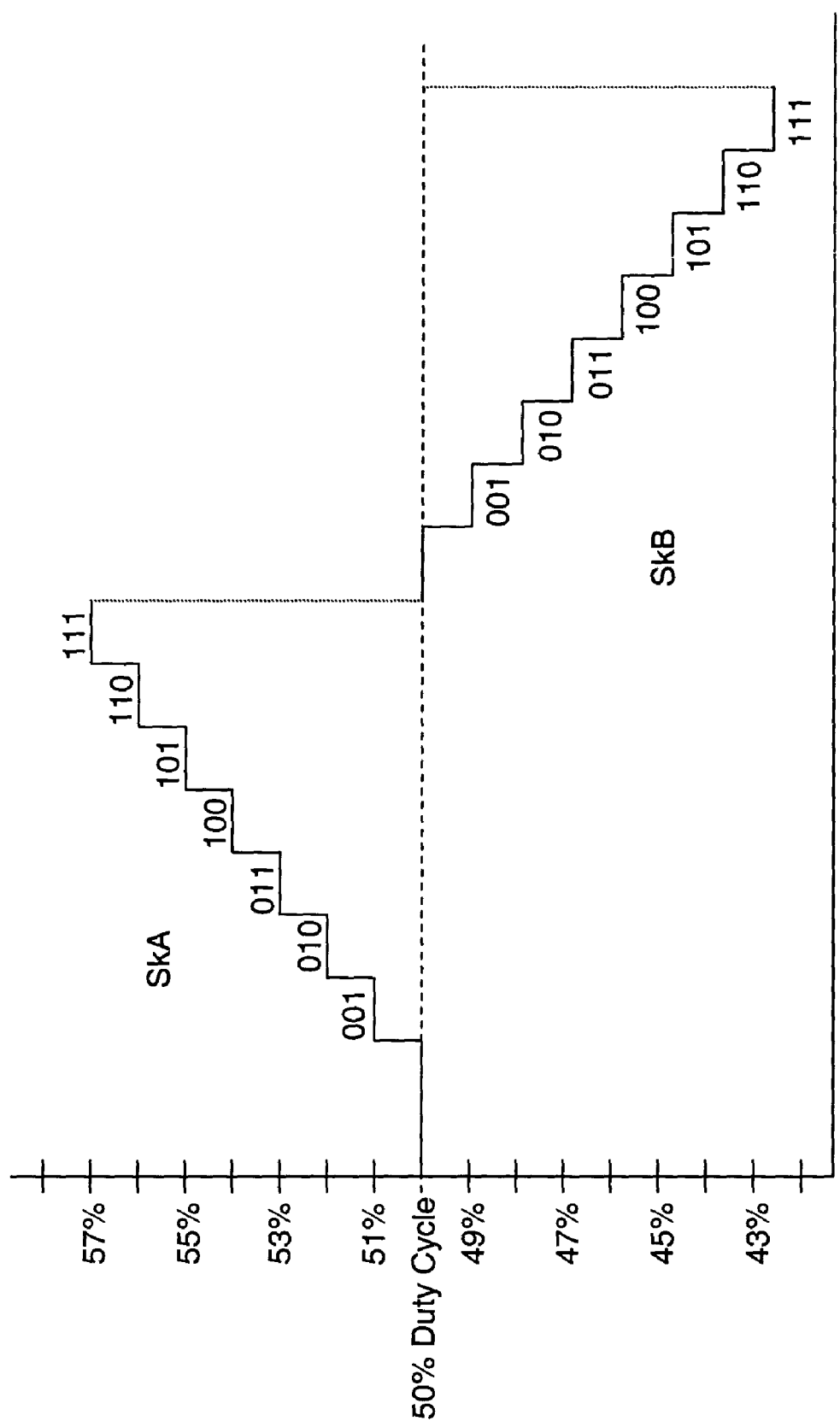
FIG. 7 is a graph illustrating changes in receiver clock duty cycle based on various skew values.

FIG. 7 illustrates an example of the application of various skew values to a set of three parallel transistors within a skew circuit such as those shown above in FIG. 6. In designing skew circuits for embodiments of the clock duty cycle adjuster, the transistors are typically sized to provide a predetermined alteration to the slew rate of a respective signal in the duty cycle adjustment circuit, and thus a predetermined change in the duty cycle of the receiver clock signal, for each increase or decrease in the value of the skew control signal. The parallel transistors may be simulated in the design process in order to choose appropriate transistor sizes that will produce, based on a signal having binary digits, known changes to the duty cycle of the receiver clock signal. In the example of FIG. 7, three parallel transistors on the A side have been chosen to produce a positive change of about 1% (e.g., from 49% to 50%) in the duty cycle of the receiver clock, and three parallel transistors on the B side have been chosen to produce a negative change of about 1% (e.g., from 51% to 50%) in the duty cycle of the receiver clock. In this explanation, changing the duty cycle by "x%" means increasing or decreasing the duty cycle percentage by X percentage points, which will typically mean changing the duty cycle by about 2× percent of the duty cycle amount since most of the duty values are close to 50%.

Thus, if Skew A Circuit receives a "001" signal (i.e., SkA3=0; SkA2=0 and SkA1=1) at the gates of the three parallel transistors, then Skew A Circuit increases the duty cycle of the receiver clock by about 1% (i.e., one percentage point, which is actually about 2% of the duty cycle amount) by turning on the 1× transistor, but not the 2× or 4× transistors. If the received data has a duty cycle of 48%, for example, then a "010" signal is applied to the Skew B circuit to reduce the receiver clock circuit by 2% from the 50% duty cycle produced by the DCC circuits. Thus, the 1× and 4×transistors on the B side skew circuit 604 (FIG. 6) are turned off and the 2× transistor is turned on. When using the duty cycle adjustment steps shown in FIG. 7, a zero adjustment value will typically be applied to one of the two skew circuits while a non-zero adjustment value is applied to the other skew circuit. Typical embodiments will adjust the receiver clock duty cycle within a range of about 10% (i.e., up to ten percentage points) above or below the predetermined duty cycle, although some embodiments may have a smaller or larger range.

Alternate embodiments may further include applying the methods and circuits described above within a clock tree structure such that one or more receiver clock duty cycles may be adjusted on a branch level, individual receiver level or even on a byte level within a given receiver. In other words, in a device that receives several bits in parallel, either a single duty cycle detection and correction circuit may be used to adjust a master receiver clock, or multiple duty cycle detection and correction circuits may be used so as to provide separately adjusted receiver clocks for receiving each bit or for receiving various groups of bits.

The foregoing description, for purpose of explanation, has been described with reference to specific embodiments. However, the illustrative discussions above are not intended to be exhaustive or to limit the invention to the precise forms disclosed. Many modifications or variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A method of adjusting a receiver clock duty cycle, comprising:
   receiving a system clock signal;
   detecting a duty cycle of a data signal;
   comparing the detected duty cycle of the data signal with a predetermined duty cycle in order to determine a first difference between the detected data signal duty cycle and the predetermined duty cycle;
   generating a receiver clock from the system clock signal; and
   adjusting a duty cycle of the receiver clock in accordance with the first difference between the detected data signal duty cycle and the predetermined duty cycle.

2. The method of claim 1, wherein detecting the duty cycle of a data signal comprises the detecting a first duty cycle of a first data signal from a first device, and detecting a second duty cycle of a second data signal from a second device;
   comparing the detected duty cycle of the data signal with a predetermined duty cycle comprises comparing the first duty cycle with a first predetermined duty cycle in order to determine a first difference between the first duty cycle and the first predetermined duty cycle, and comparing the second duty cycle with a second predetermined duty cycle in order to determine a second difference between the second duty cycle and the second predetermined duty cycle; and
   adjusting a duty cycle of the receiver clock comprises adjusting a duty cycle of the receiver clock in accordance with the first difference when a receiver receives a data signal from the first device and adjusting the duty cycle of the receiver clock in accordance with the second difference when the receiver receives a data signal from the second device.

3. The method of claim 2, wherein the first and second data signals have signaling types which are different.

4. The method of claim 3, wherein the first and second predetermined duty cycles are different.

5. The method of claim 2, wherein the first and second devices are located on different integrated circuits.

6. The method of claim 1, including
   detecting a duty cycle of the system clock signal;
   comparing the duty cycle of the system clock signal with the predetermined duty cycle in order to determine a third difference between the detected system clock signal duty cycle and the predetermined duty cycle; and
   adjusting the duty cycle of the receiver clock in accordance with the third difference.

7. The method of claim 6, wherein the third difference is less than about 10% of the predetermined duty cycle.

8. The method of claim 6, wherein the adjusting includes adjusting the duty cycle of the receiver clock such that a difference between the duty cycle of the receiver clock and the predetermined duty cycle is less than the third difference.

9. The method of claim 6, wherein the adjusting includes generating a duty cycle correction value based on the third difference and applying the duty cycle correction value to an amplifier circuit configured to alter the receiver clock signal duty cycle based on the duty cycle correction value.

10. The method of claim 9, wherein the duty cycle correction value determines which transistors are turned on in a binary-weighted set of transistors.

11. The method of claim 9, wherein the duty cycle correction value determines a voltage applied to a gate in a duty cycle correction circuit within the amplifier.

12. The method of claim 1, including processing the data signal using the duty cycle of the adjusted receiver clock.

13. The method of claim 1, wherein the predetermined duty cycle is 50%.

14. The method of claim 1, wherein the adjusting includes adjusting the duty cycle of the receiver clock such that a difference between the duty cycle of the receiver clock and the detected duty cycle of the data signal is less than the first difference.

15. The method of claim 1, wherein the adjusting includes generating a skew value based on the first difference and storing the skew value in a register.

16. The method of claim 15, further comprising applying the skew value to an amplifier circuit configured to alter the receiver clock signal duty cycle based on the skew value.

17. The method of claim 16, wherein the skew value determines which transistors are turned on in a binary-weighted set of transistors.

18. The method of claim 1, wherein the first difference is less than about 10% of the predetermined duty cycle.

19. The method of claim 1, wherein the method is performed by an integrated circuit and the data signal is received from a module with the integrated circuit.

20. The method of claim 1, wherein the method is performed by a first integrated circuit and the data signal is received from another integrated circuit.

21. An integrated circuit, comprising:
a clock receiver configured to receive a system clock signal having a duty cycle;
a data signal duty cycle detector configured to detect a first duty cycle of a first data signal and to generate a first difference signal representing a difference between the first duty cycle and a first predetermined duty cycle; and
a receiver clock generator configured to output a receiver clock signal based on the system clock signal and the first difference signal, the receiver clock generator including a one or more correction circuits configured to adjust a duty cycle of the receiver clock signal in accordance with the first difference signal.

22. The integrated circuit of claim 21, wherein the data signal duty cycle detector is further configured to detect a second duty cycle of a second data signal and to generate a second difference signal representing a difference between the second data signal duty cycle and a second predetermined duty cycle; the first data signal has a first data signal type, the second data signal has a second data signal type, and the receiver clock generator is further configured to output a first receiver clock signal based on the system clock signal and the first difference signal when a receiver receives a data signal of the first data signal type and to output a second receiver clock signal based on the system clock signal and the second difference signal when the receiver receives a data signal of the second data signal type.

23. The integrated circuit of claim 22, wherein the first and second data signaling types are different.

24. The integrated circuit of claim 23, wherein the first and second predetermined duty cycles are different.

25. The integrated circuit of claim 22, wherein data signals of the first data signaling type are from a first device and data signals of the second signal type are from a second device.

26. The integrated circuit of claim 25, wherein the first and second devices are located on different integrated circuits.

27. The integrated circuit of claim 21, including
a clock duty cycle detector configured to detect a duty cycle of the system clock signal and to generate a third difference signal representing a difference between the detected system clock signal duty cycle and the first predetermined duty cycle; and
wherein the one or more correction circuits are configured to adjust the duty cycle of the receiver clock signal in accordance with the third difference signal.

28. The integrated circuit of claim 27, wherein the third difference is less than about 10% of the predetermined duty cycle.

29. The integrated circuit of claim 27, wherein the one or more correction circuits adjust the duty cycle of the receiver clock such that a difference between the duty cycle of the receiver clock and the predetermined duty cycle is less than the third difference.

30. The integrated circuit of claim 27, wherein the duty cycle correction value is applied to an amplifier circuit configured to alter the receiver clock signal duty cycle based on the duty cycle correction value.

31. The integrated circuit of claim 30, wherein the duty cycle correction value determines which transistors are turned on in a binary-weighted set of transistors.

32. The integrated circuit of claim 30, wherein the duty cycle correction value determines a voltage applied to a gate in a duty cycle correction circuit within the amplifier.

33. The integrated circuit of claim 21, including a detector configured to process the data signal using the duty cycle of the adjusted receiver clock signal.

34. The integrated circuit of claim 21, wherein the predetermined duty cycle is 50%.

35. The integrated circuit of claim 21, wherein the one or more correction circuits adjust the duty cycle of the receiver clock such that a difference between the duty cycle of the receiver clock and the first duty cycle is less than the first difference.

36. The integrated circuit of claim 21, wherein the data signal duty cycle detector generates a duty cycle correction value based on the first difference and stores the duty cycle correction value in a register.

37. The integrated circuit of claim 36, wherein the duty cycle correction value is applied to an amplifier circuit configured to alter the receiver clock signal duty cycle based on the duty cycle correction value.

38. The integrated circuit of claim 37, wherein the duty cycle correction value determines which transistors are turned on in a binary-weighted set of transistors within the amplifier circuit.

39. The integrated circuit of claim 21, wherein the first difference is less than about 10% of the predetermined duty cycle.

40. The integrated circuit of claim 21, wherein the first data signal is received from a module within the integrated circuit.

41. The integrated circuit of claim 21, wherein the first data signal is received from another integrated circuit.

42. An integrated circuit, comprising:
means for receiving a system clock signal having a duty cycle;
means for detecting a duty cycle of a data signal and for generating a first difference signal representing a difference between the detected data signal duty cycle and a predetermined duty cycle; and
means for generating a receiver clock signal based on the system clock signal and the first difference signal, including means for adjusting a duty cycle of the receiver clock signal in accordance with the first difference signal.

* * * * *

UNITED STATES PATENT AND TRADEMARK OFFICE
CERTIFICATE OF CORRECTION

PATENT NO. : 7,307,461 B2
APPLICATION NO. : 10/661225
DATED : December 11, 2007
INVENTOR(S) : Nguyen et al.

It is certified that error appears in the above-identified patent and that said Letters Patent is hereby corrected as shown below:

In the Claims:

Column 13, line 29, please delete the word "a".

Signed and Sealed this

Twenty-ninth Day of April, 2008

JON W. DUDAS
*Director of the United States Patent and Trademark Office*